United States Patent
Tsujimura et al.

(10) Patent No.: US 7,054,211 B2
(45) Date of Patent: May 30, 2006

(54) SEMICONDUCTOR MEMORY STORAGE DEVICE CAPABLE OF HIGH OPERATING SPEED

(75) Inventors: Kazuki Tsujimura, Shiga (JP); Hidenari Kanehara, Osaka (JP); Norihiko Sumitani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 83 days.

(21) Appl. No.: 10/732,297

(22) Filed: Dec. 11, 2003

(65) Prior Publication Data

US 2004/0202035 A1 Oct. 14, 2004

(30) Foreign Application Priority Data

Dec. 18, 2002 (JP) ............................ P2002-366651

(51) Int. Cl.
*G11C 7/00* (2006.01)

(52) U.S. Cl. ................. 365/204; 365/210; 365/230.06; 365/189.06; 365/189.11

(58) Field of Classification Search ................ 365/204, 365/210, 230.06, 189.08, 189.11, 330.06
See application file for complete search history.

(56) References Cited

U.S. PATENT DOCUMENTS

| | | | | |
|---|---|---|---|---|
| 5,268,865 A | * | 12/1993 | Takasugi | 365/189.05 |
| 5,703,821 A | * | 12/1997 | Baroni et al. | 315/210 |
| 6,341,100 B1 | * | 1/2002 | Fujioka | 365/233 |
| 6,487,115 B1 | * | 11/2002 | Tsuruda | 365/185.04 |
| 6,525,985 B1 | | 2/2003 | Mizuno et al. | |
| 6,545,918 B1 | * | 4/2003 | Song | 365/189.11 |
| 6,556,472 B1 | * | 4/2003 | Yokozeki | 365/154 |
| 2003/0132457 A1 | | 7/2003 | Lee et al. | |

FOREIGN PATENT DOCUMENTS

JP 2001-351385 A 12/2001

* cited by examiner

*Primary Examiner*—Connie C. Yoha
(74) *Attorney, Agent, or Firm*—McDermott Will & Emery LLP

(57) ABSTRACT

A semiconductor memory storage is disclosed, in which the gate of each of a plurality of n-channel transistors is connected to the corresponding one of a plurality of word lines on the output side of each word line driver. The source of the n-channel transistor is connected through a selective switching element to the gate of the corresponding one of a plurality of replica transistors connected to a dummy bit line. The gate of each replica transistor is connected to the corresponding one of discharge transistors. The dummy bit line is connected to a sense amplifier through a logic gate.

14 Claims, 5 Drawing Sheets

23: Replica transistor
25: Dummy bit line
A: Word line responsive sense amplifier control circuit

SEMICONDUCTOR MEMORY STORAGE DEVICE CAPABLE OF HIGH OPERATING SPEED

BACKGROUND OF THE INVENTION

The present invention relates to a semiconductor memory storage, and in particular to a random-access semiconductor memory storage comprising a memory cell array having a plurality of memory cells arranged in a matrix, a plurality of word line drivers each connected through the corresponding one of a plurality of word lines to the corresponding one of a plurality of the memory cells arranged in a row in the memory cell array for activating a selected word line as the result of decoding an address signal, and a sense amplifier for detecting the activated state of the memory cells.

A semiconductor memory storage is known which has a circuit for correcting the effect of variations in production conditions for forming a memory cell array on a silicon substrate, and variations of the environmental temperature conditions and voltage conditions.

FIG. 5 is a circuit diagram schematically showing the conventional semiconductor memory storage. This semiconductor memory storage comprises a memory cell array 2 with a plurality of memory cells 1 arranged in a matrix, and a word line driver 4 for activating a word line selected in accordance with the result of address decoding by a pre-decoder 3. A plurality of the memory cells 1 arranged in a column are connected to a corresponding sense amplifier 6 through a pair of bit lines 5. Further, a replica column 7 of the memory cells 1 is arranged beside the memory cell array 2, and the gate of the pass transistor of each replica memory cell 8 is connected to an address logic circuit 9 through a dummy word line 10. Furthermore, a dummy bit line 11 connected with a predetermined number of the replica memory cells 8 is connected to the sense amplifier 6 as a signal line for an enable signal.

In this configuration, an input address is decoded by the address logic circuit 9 and a given one of the word line drivers 4, a specified memory cell 1 is selected, and the selected memory 1 generates a potential difference between the pair of bit lines 5. Also, the gates of the pass transistors of a predetermined number of the replica memory cells 8 are activated through the dummy word line 10 from the address logic circuit 9. Further, an enable signal for the sense amplifier 6 is generated on the dummy bit line 11 through the column I/O logic circuit 12. The sense amplifier 6 that has received the enable signal detects the potential difference generated between the pair of bit lines 5.

In the conventional semiconductor memory storage device described above, the signal path for activating the memory cells and the signal path for activating the sense amplifier are separated from each other. Specifically, the word line selected through the word line driver 4 from the pre-decoder 3 and the dummy bit line 11 from the address logic circuit 9 through the replica memory cell 8 and the column I/O logic circuit 12 are separate from each other. Since these two signal lines are separate from each other, the accuracy of the timing at which the word line is actually activated is low. Therefore, in order to avoid a malfunction, a considerable margin is required for the timing of the enable signal for the sense amplifier. Also, the use of a replica memory cell having a similar configuration to the memory cells in the replica column leads to a redundant circuit configuration including the accompanying column I/O logic circuit 12, thereby posing the problem of an area overhead.

SUMMARY OF THE INVENTION

Accordingly, the primary object of the invention is to provide a semiconductor memory storage in which a higher operating speed with a sense timing of higher accuracy and a smaller occupied area are realized by the design of the transmission path of an enable signal for a sense amplifier.

The above and other objects, features and advantages will be made apparent by the following detailed description.

In order to achieve the above-mentioned object, this invention employs the means described below.

As a first solution, a semiconductor memory storage according to the invention comprises:

a memory cell array with a plurality of memory cells arranged in a matrix;

a plurality of word line drivers each connected fthrough a word line to a plurality of the memory cells arranged in a row in the memory cell array to activate the word line according to the result of decoding an address signal; and a sense amplifier for detecting the activated state of the memory cells.

The semiconductor memory storage having this configuration further comprises a sense amplifier control circuit adapted to operate in response to the activation of a word line. The sense amplifier control circuit is connected to the word lines and the sense amplifier is activated with the activation of the word lines.

The sense amplifier control circuit responsive to the word lines generates an enable signal for the sense amplifier using an activation signal of a selected word line to activate the sense amplifier. Specifically, the enable signal for the sense amplifier is generated not from a different path but from the same path of the word line used for actual operation. Therefore, regardless of variations of production conditions in forming a memory cell array on a silicon substrate and the variations in temperature or voltage conditions, the timing of activation of the sense amplifier can be controlled accurately.

More specifically, the sense amplifier control circuit responsive to the word lines preferably includes:

a discharge switching element inserted between a dummy bit line and the grounding potential;

a plurality of switching elements connected and responsive to the word lines for transmitting the activation signal for the word lines to the discharge switching element; and a logic gate for outputting an enable signal for the sense amplifier in response to the discharge operation of the dummy bit line.

With this configuration, once a word line is activated, the word line responsive switching element supplied with the activation signal of the particular word line turns on the discharge switching element, and by connecting the dummy bit line to the ground potential, discharges the dummy bit line. This discharge decreases the potential of the dummy bit line with a predetermined time constant, and upon the lapse of a predetermined length of time, the logic gate is opened to output a read enable signal as an enable signal for the sense amplifier.

More specifically, the word line responsive sense amplifier circuit according to another aspect of the invention preferably includes:

a plurality of the discharge switching elements connected in parallel to the dummy bit line; and a plurality of word line responsive switching elements closed by the activation signal of the word lines for activating a control signal and applying the activated control signal to the control terminals of the plurality of the discharge switching elements.

With this configuration, the dummy bit line can be discharged at high speed on the same path as the word lines using a plurality of the discharge switching elements in response to the activation of the word lines. This in turn increases the speed of generating an enable signal for the sense amplifier.

More preferably, a selective switching element is interposed between each of the word line responsive switching elements and the corresponding one of the discharge switching elements.

With this configuration, the number of the effective discharge switching elements actually connected to the dummy bit line can be adjusted by turning on/off the selective switching elements. As a result, the enable signal for the sense amplifier can be set to a proper timing more easily by adjusting the discharge rate of the dummy bit line.

Preferably, the discharge switching element is a replica of the n-channel field-effect transistor of the memory cell. The replica n-channel field-effect transistor is one component element of a replica memory cell and occupies a smaller area than the replica memory cell. Also, the redundant column I/O logic circuit is not required. Therefore, the circuit area is reduced as a whole.

Thus, according to another aspect of the invention, there is provided a semiconductor memory storage comprising:

a memory cell array with a plurality of memory cells arranged in a matrix;

a plurality of word line drivers each connected through a word line to a plurality of the memory cells arranged in a row in the memory cell array to activate the word line according to the result of decoding an address signal; and a sense amplifier connected to a pair of bit lines connected to a plurality of the memory cells arranged in a column to detect the potential difference between the bit lines by the operation of reading the memory cells.

The semiconductor memory storage configured as described above further comprises a plurality of n-channel field-effect transistors, a plurality of replica n-channel field-effect transistors and a logic gate. The n-channel field-effect transistors each have the gate thereof connected to the corresponding one of the word lines, and the drain thereof to the high-potential side of a power supply. The plurality of the replica n-channel field-effect transistors, on the other hand, are inserted in parallel between a dummy bit line and the ground potential, and each have the gate thereof connected to the source of the corresponding n-channel field-effect transistor. The logic gate outputs a read enable signal as an enable signal for the sense amplifier by the discharge of the dummy bit line in response to the turning on of the replica n-channel field-effect transistors.

The operation based on this configuration is described. Upon activation of a given word line, the corresponding n-channel field-effect transistor and a plurality of the replica n-channel field-effect transistors turn on, with the result that the dummy bit line is grounded and discharged. This discharge decreases the potential of the dummy bit line, and inverts the logic gate. Then, the read enable signal input to the logic gate is output as an enable signal for the sense amplifier. In this case, the enable signal for the sense amplifier is generated by use of the activation signal of a selected word line. The enable signal for the sense amplifier is generated not from a different path but from the same path of the word line. Therefore, regardless of the variations of the production conditions, temperature or voltage, the timing of activation of the sense amplifier can be accurately controlled. Also, in view of the fact that the dummy bit line is discharged using a plurality of discharge switching elements, the speed at which the dummy bit line is discharged in response to the word line activation can be increased. In this way, the enable signal for the sense amplifier is generated at a higher rate. The replica n-channel field-effect transistor constitutes one component element of the replica memory cell and occupies a smaller area than the latter. Also, the redundant column I/O logic circuit is not required. The circuit area is thus reduced as a whole.

Preferably, a selective switching element is inserted between the n-channel field-effect transistor and each of the replica n-channel field-effect transistors. This configuration makes it possible to regulate the number of the effective replica n-channel field-effect transistors actually connected to the dummy bit line for discharge by turning on/off the selective switching elements. As a result, the discharge rate of the dummy bit line can be regulated and the proper timing is easily achieved for the enable signal of the sense amplifier.

In still another preferred aspect of the configuration described above, the memory cell array further comprises a metal wire arranged adjacently in parallel to the dummy bit line and having an end thereof grounded, and a plurality of selective switching elements inserted at predetermined intervals on the metal wire. In this case, a parasitic capacitance is formed between the dummy bit line and the metal wire. By turning on/off the selective switching elements, the effective parasitic capacitance can be regulated. As a result, the proper timing of the enable signal for the sense amplifier can be easily achieved by regulating the discharge rate of the dummy bit line.

Also, in the configuration described above, each n-channel field-effect transistor may be replaced with an inverter for logically inverting outputs of the word line driver and a p-channel field-effect transistor with the gate thereof connected to the inverter and the source thereof connected to the high-potential side of the power supply. In this way, the discharge rate of the dummy bit line can be increased by increasing the gate voltage of the replica n-channel field-effect transistors to the source voltage. Also, an operation margin can be secured to compensate for a possible source voltage drop, thereby stabilizing the circuit operation.

According to yet another aspect of the invention, the configuration described above preferably further comprises a row decoding circuit for stopping the operation of selecting a selected word line driver in response to the enable signal for the sense amplifier. As a result, the word line thus far selected is deactivated by the enable signal of the sense amplifier, and therefore the activation time of the word lines is reduced to a required minimum thereby reducing the power consumption.

According to a further aspect of the invention, the configuration described above preferably further comprises a timing control circuit for the sense amplifier having the following functions. Specifically, the timing control circuit for the sense amplifier outputs a specified data and a predetermined write data, and in response to the detection output of the sense amplifier, makes a determination for the write operation. In the case where the write operation is successful, the timing control circuit outputs a control signal for progressively increasing the number of times the plurality of the selective switching elements are turned on. This operation is repeated until the write operation fails. The larger the number of times the selective switching elements are turned on, the higher the discharge rate of the dummy bit line is. An excessively high discharge rate, however, would lead to an unsuccessful write operation. In view of this, the optimum number of times the selective switching elements are turned on for optimum discharge rate is adaptively determined. In this way, the optimum timing of the enable signal for the sense amplifier can be automatically set.

Also, the discharge switching elements and the replica n-channel field-effect transistors are each preferably configured of a transistor of a dummy cell for optical correction around the memory cell. The dummy cells for optical correction are arranged around the array in order to suppress the variations of the production conditions. By use of these dummy cells for optical correction, the circuit area can be further reduced.

As described above, according to this invention, an enable signal is generated from the word line used for the actual operation, and therefore the timing of activating the sense amplifier can be accurately controlled. Also, the use of the required minimum number of replica transistors reduces the circuit area.

The foregoing and other aspects will become apparent from the following description of the invention when considered in conjunction with the accompanying drawings.

BRIEF DESCRIPTION OF THE DRAWINGS

In all these drawings, like components are indicated by the same numerals, respectively.

DETAILED DESCRIPTION OF THE INVENTION

A semiconductor memory storage according to an embodiment of the invention is explained below in detail with reference to the drawings.

FIRST EMBODIMENT

Figure 1:
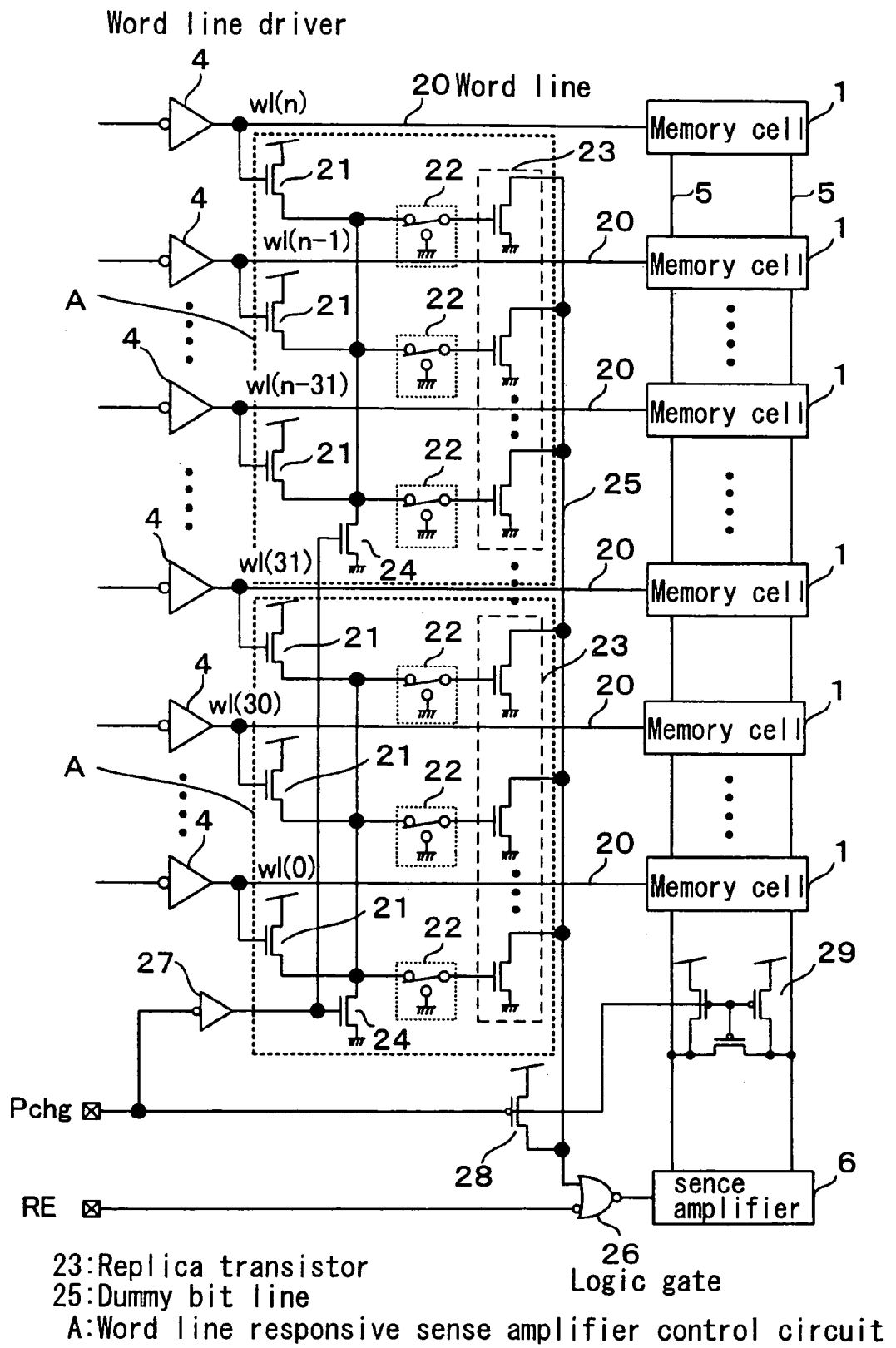
FIG. 1 is a schematic circuit diagram of a semiconductor memory storage according to a first embodiment of the invention.
Figure 5:
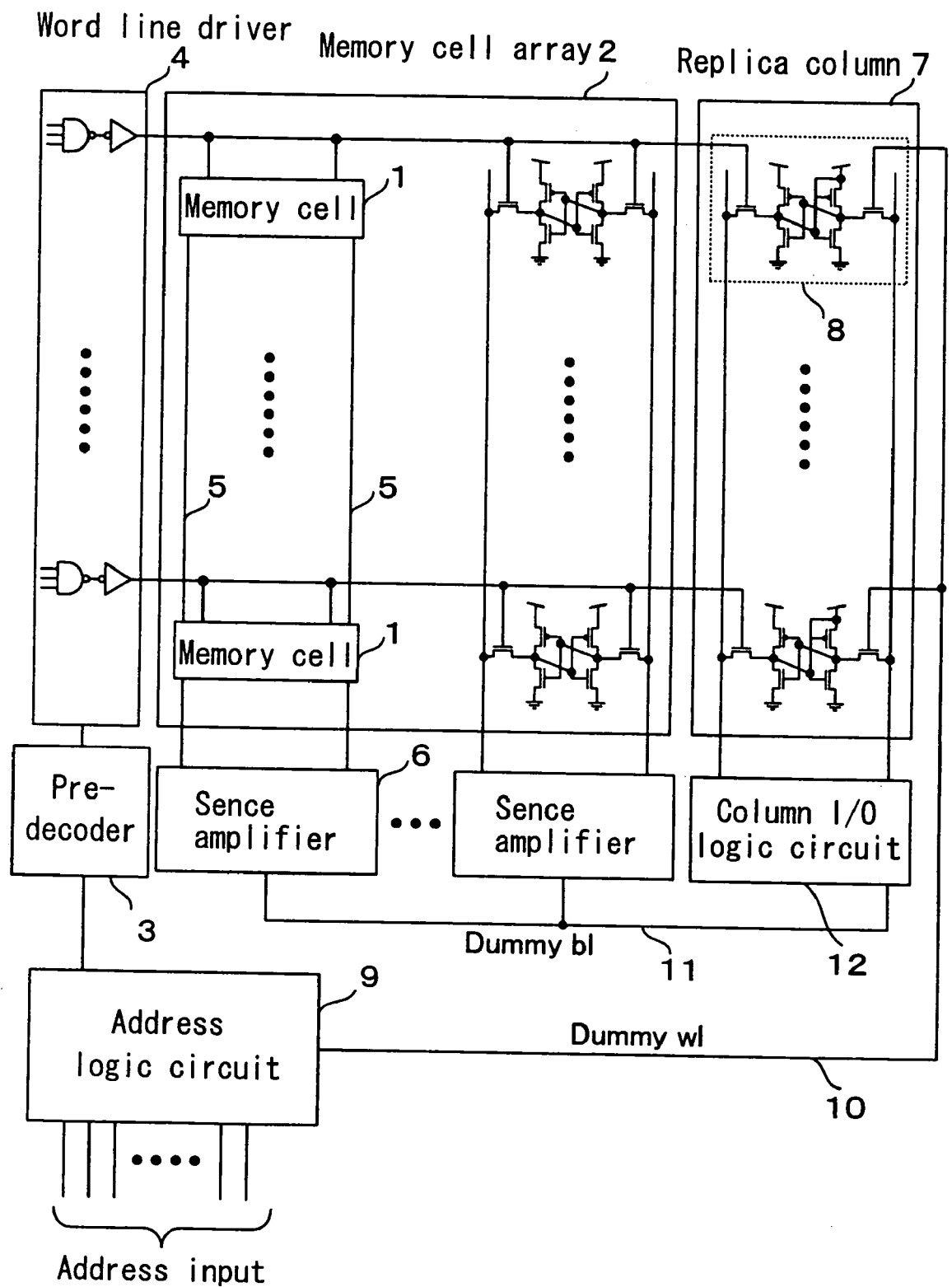
FIG. 5 is a schematic circuit diagram of a conventional semiconductor memory storage.

FIG. 1 is a schematic circuit diagram of a static random-access memory (hereinafter referred to as SRAM) as a semiconductor memory storage according to a first embodiment of the invention. In FIG. 1, the same component parts as the corresponding ones in FIG. 5 showing a conventional semiconductor memory storage are designated by the same reference numerals, respectively and not described again. In FIG. 1, each of a plurality of word lines 20 connected to the corresponding one of a plurality of word drivers 4 and the corresponding one of a plurality of memory cells 1 branches and is connected to the gate of the corresponding one of a plurality of n-channel field-effect transistors (hereinafter referred to as the n-ch transistors) 21 as a word line responsive switching element. The drain of the n-ch transistor 21 is connected to the high potential side of a power supply, and the source thereof is connected through a selective switching element 22 to the gate of a replica n-channel field-effect transistor (hereinafter referred to as the replica transistor) 23. The replica transistor 23 is an n-channel field effect transistor having an equivalent configuration to a pass transistor (not shown) of the memory cell 1. The replica transistors 23 are connected at predetermined intervals in parallel to a dummy bit line 25. The source of each n-ch transistor 21 is connected through a corresponding selective switching element 22 to each of the gates of a predetermined number of the replica transistors 23. Also, each of the gates of the predetermined number of the replica transistors 23 is connected through a corresponding selective switching element 22 to each of the sources of the n-ch transistors 21 of the same number of the word lines 20 in corresponding positions. The "predetermined number" is normally equal to the number of cells between the power tap cells. Each of the gates of the predetermined number of the replica transistors 23 interconnected is connected to a discharge transistor 24 through a selective switching element 22. The dummy bit line 25 connecting a plurality of the replica transistors 23 in parallel to each other is connected to one input terminal of a logic gate 26. The other input terminal of the logic gate 26 is supplied with a logically inverted read enable signal (RE). The logic gate 26 is configured of an OR circuit, the output of which is logically inverted and connected to a sense amplifier 6. The replica transistors 23 are turned on by an activation signal of the word lines 20, and the logic gate 26 is inverted by the discharge of the dummy bit line 25. The time constant of the discharge of the dummy bit line 25 can be regulated by adjusting the number of times the selective switching elements 22 are turned on/off.

The predetermined number of the n-ch transistors 21, the selective switching elements 22, the replica transistors 23 and the discharge transistors 24 described above make up a word line responsive sense amplifier control circuit A for activating the sense amplifier 6 with an activation signal of the word lines 20. The discharge transistors 24 are for resetting the word line responsive sense amplifier control circuit A. A precharge signal is applied to the gate of each discharge transistor 24 of the word line responsive sense amplifier A through an inverter 27. Numeral 28 designates a precharge transistor, and numeral 29 a precharge circuit. The precharge transistor 28 is a p-channel field-effect transistor, the drain of which is connected to the dummy bit line 25 and one input terminal of the logic gate 26.

The operation of the semiconductor memory storage according to this embodiment having the aforementioned configuration is explained below.

In accordance with the result of decoding an input address signal (not shown), one of the word line drivers 4 is selected. Upon activation of the word line 20, the corresponding memory cell 1 begins the read operation and generates a potential difference between a pair of bit lines 5. At the same time, the n-ch transistors 21 of the word line responsive sense amplifier control circuit A turn on, so that a predetermined number of the replica transistors 23 are activated, thereby discharging the dummy bit line 25 which is in the precharged state. The number of the replica transistors 23 activated is determined by the turning on/off of the selective switching elements 22. Upon the lapse of a predetermined length of time, the logic gate 26 is inverted and turned on, and outputs a read enable signal as an enable signal for the sense amplifier 6. As a result, the sense amplifier 6 is activated, and detects a potential difference generated between the pair of the bit lines 5.

Once the precharge cycle is entered, the word line drivers 4 are set in unselected state, so that a pair of the bit lines 5 and the dummy bit line 25 are precharged through the precharge transistor 28 and the precharge circuit 29, with the result that the gate of each replica transistor 23 is discharged by the inverter 27 and the discharge transistor 24 to be back into an initial state.

As described above, according to this embodiment, the dummy bit line 25 is controlled using the word lines 20 actually operated, and therefore, without regard to the variations in the production conditions, temperature conditions or voltage conditions of the decode circuit, the sense amplifier 6 can be stably activated at an appropriate timing with high accuracy. For controlling the dummy bit line 25, on the other hand, two transistors including the n-ch transistor 21 and the replica transistor 23 are used for each word line 20, and therefore, the configuration is realized with a small area on a silicon substrate.

The selective switching elements 22 may be operated as a mask option of the wiring layer or may be configured of a circuit.

SECOND EMBODIMENT

Figure 2A:
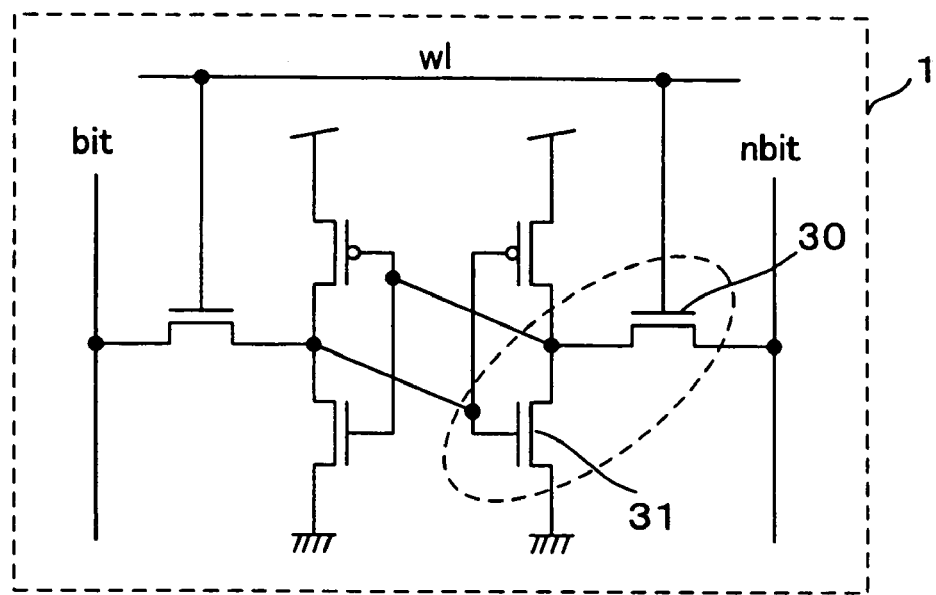
FIG. 2A is a schematic circuit diagram of a memory cell of a semiconductor memory storage according to a second embodiment of the invention.
Figure 2B:
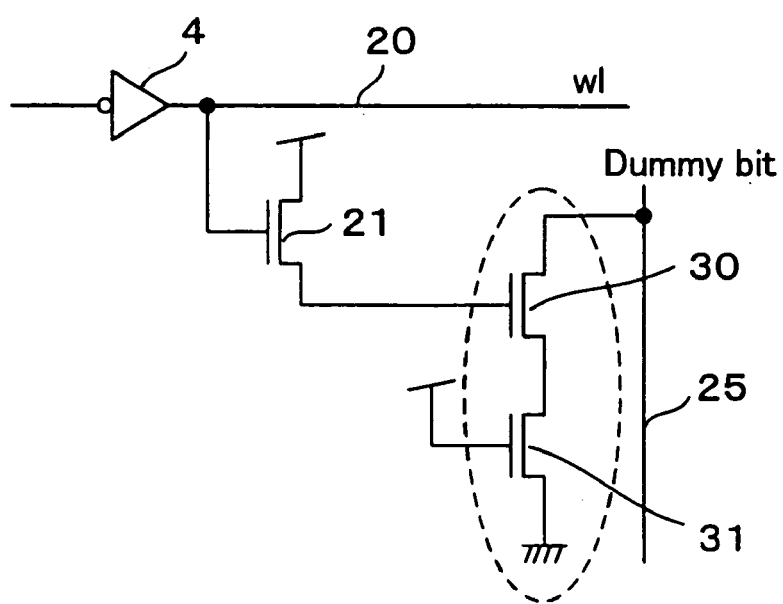
FIG. 2B is a circuit diagram of a word line responsive sense amplifier control circuit according to the second embodiment of the invention.

FIG. 2A is a schematic circuit diagram of a SRAM as a semiconductor memory storage according to a second embodiment of the invention. In FIG. 2A, the same component parts as the corresponding ones of the prior art shown in FIG. 5 and the embodiment shown in FIG. 1 are designated by the same reference numerals, respectively, and not described again. In FIG. 2, the replica transistor 23 shown in FIG. 1 is arranged as a dummy cell for optical correction. The dummy cell for optical correction is arranged in order to suppress the variations of the characteristics of the memory cells.

The pass transistor 30 and the drive transistor 31 shown in FIG. 2A are used as dummy transistors for optical correction. The replica transistor 23 in FIG. 1 is configured of a pass transistor 30 shown in FIG. 2B and a drive transistor 31 with the gate thereof fixed to the high potential side of the power supply in saturated form.

The operation of the semiconductor memory storage according to this embodiment having the above-mentioned configuration is essentially the same as that of the first embodiment and therefore is not explained again.

As described above, according to this embodiment, the dummy cell for suppressing the variations of the memory cell characteristics is used equivalently to the replica transistor 23, so that substantially the same effect as the first embodiment is obtained without increasing the occupied area.

THIRD EMBODIMENT

Figure 3:
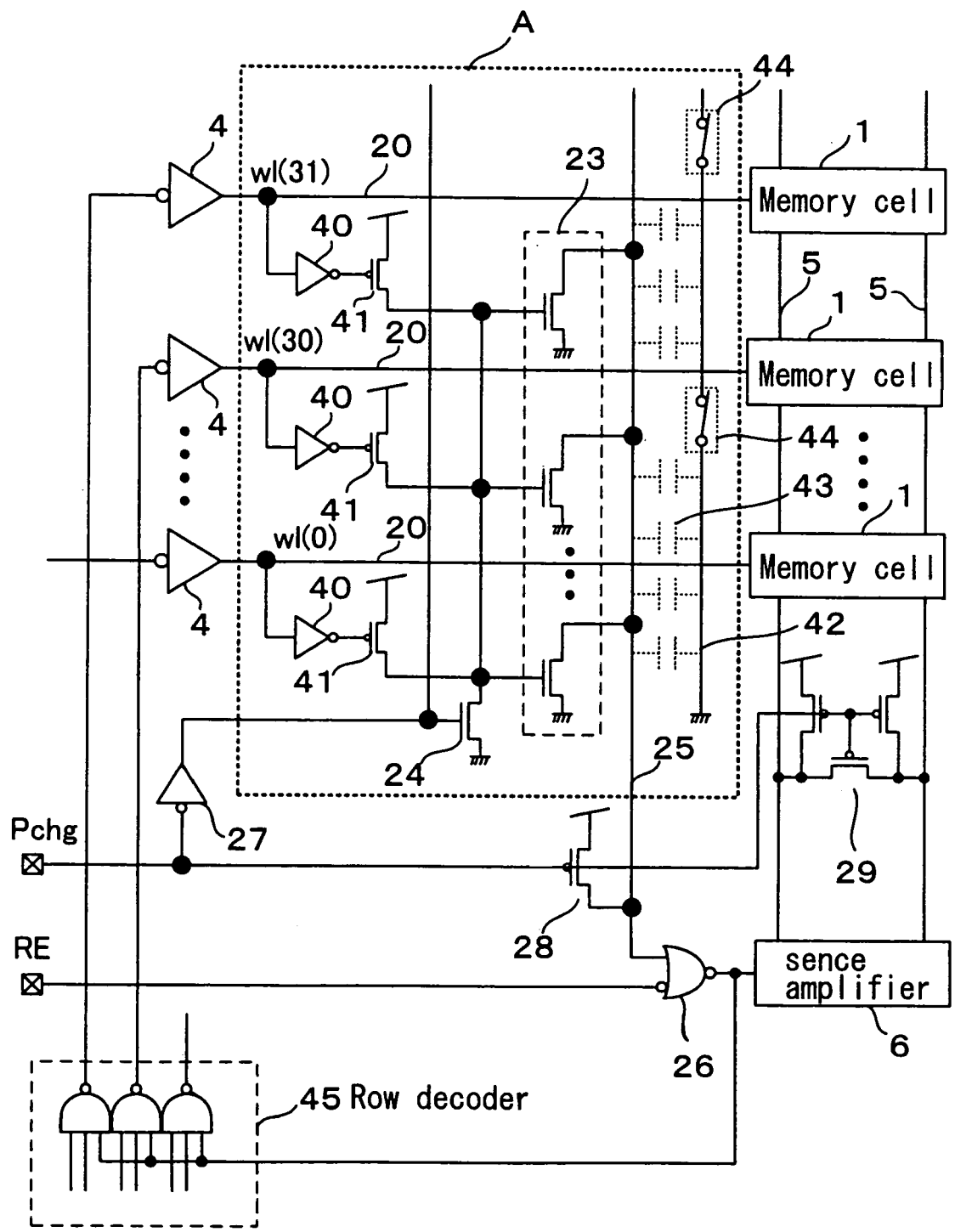
FIG. 3 is a schematic circuit diagram of a semiconductor memory storage according to a third embodiment of the invention.

FIG. 3 is a schematic circuit diagram of a SRAM as a semiconductor memory storage according to a third embodiment of the invention. In FIG. 3, the same component parts as the corresponding ones of the prior art shown in FIG. 5 and the embodiment shown in FIG. 1 are designated by the same reference numerals, respectively, and therefore not described again. In FIG. 3, a logically inverting gate (inverter) 40 is connected to the branch line from each word line 20 on the output side of each word line driver 4, and the output of the logically inverting gate 40 is connected to the gate of a p-channel field-effect transistor (hereinafter referred to as the p-ch transistor) 41 as a work line responsive switching element. The source of the p-ch transistor 41 is connected to the high potential side of the power supply. The drain of the p-ch transistor 41 is connected to the gate of the replica transistor 23. The drain of each p-ch transistor 41, on the other hand, is connected to the gates of a predetermined number of replica transistors 23. At the same time, the gates of the predetermined number of the replica transistors 23 are connected to the drains of the p-ch transistors 41 of the same number of the positionally corresponding word lines, respectively. The "predetermined number" is normally the same number as the cells between the power tap cells. The gates of the predetermined number of the interconnected replica transistors 23 are connected to a discharge transistor 24 through the selective switching element 22.

Further, at the time of forming a SRAM on a silicon substrate, a metal wire 42 is formed adjacently in parallel to the dummy bit line 25, so that a parasitic capacitance 43 is formed between the dummy bit line 25 and the metal wire 42. An end of the metal wire 42 is grounded. In order to regulate the capacitance value of each parasitic capacitance 43, the length of the metal wire 42 is variably controlled. Specifically, selective switching elements 44 are inserted at intervals of a predetermined number of memory cells 1 (normally equal to the number of the cells between the power tap cells), and by adjusting the number of times the selective switching elements 44 are turned on/off, the length of the metal wire 42 is determined.

Also, the enable signal output to the sense amplifier 6 from the logic gate 26 is fed back to a row decoder 45. The row decoder 45 is supplied with an address signal and outputs the result of decoding the address signal to the word line driver 4. The row decoder 45 is configured of a plurality of AND circuits, and one input of each circuit is connected with an enable signal for the sense amplifier 6.

The operation of the semiconductor memory storage according to this embodiment having the aforementioned configuration is explained below.

The basic operation is substantially the same as that of the first embodiment. The difference from the first embodiment lies in that once a given word line driver 4 is selected, the corresponding p-ch transistor 41 is turned on by the output of the word line driver 4 inverted by the corresponding logically inverting gate 40 in the word line responsive sense amplifier control circuit A, so that the voltage of the gates of a predetermined number of the replica transistors 23 is increased up to the source voltage so as to sufficiently activate the replica transistors 23. As a result, the dummy bit line 25 in precharged state is discharged. Upon the lapse of a predetermined length of time, the logic gate 26 is inverted and turned on, so that the read enable signal is output as an enable signal for the sense amplifier 6. Thus, the sense amplifier 6 is activated and detects the potential difference generated between a pair of the bit lines 5.

In this case, the capacitance value of the parasitic capacitance 43 formed between the dummy bit line 25 and the metal wire 42 on the layout is controlled by turning on/off the selective switching elements 44. In this way, the timing of the enable signal for the sense amplifier 6 is regulated.

Once the logic gate 26 is inverted and the enable signal for the sense amplifier 6 is activated, the row decoder 45 is reset, and the word line driver 4 that has been selected is set in an unselected state. Thus, the corresponding word line 20 is forcibly returned to an inactive state.

As described above, according to this embodiment, in addition to the effect of the first embodiment, the dummy bit line 25 can be discharged quickly by increasing the gate voltage of the replica transistors 23 up to the source voltage level. Also, an operation margin can be secured in case of a source voltage drop, thereby realizing a stable circuit operation. Further, the timing of the enable signal for the sense amplifier 6 can be finely adjusted by the parasitic capacitance 43 between the dummy bit line 25 and the metal wire 42. Furthermore, by deactivating a selected word line using the enable signal for the sense amplifier 6, the unnecessary discharge operation for the bit lines 5 by the memory cells 1 can be stopped for a reduced power consumption.

Incidentally, the selective switching elements 44 may be formed as a mask option of the wiring layer or may be configured of a circuit.

FOURTH EMBODIMENT

Figure 4:
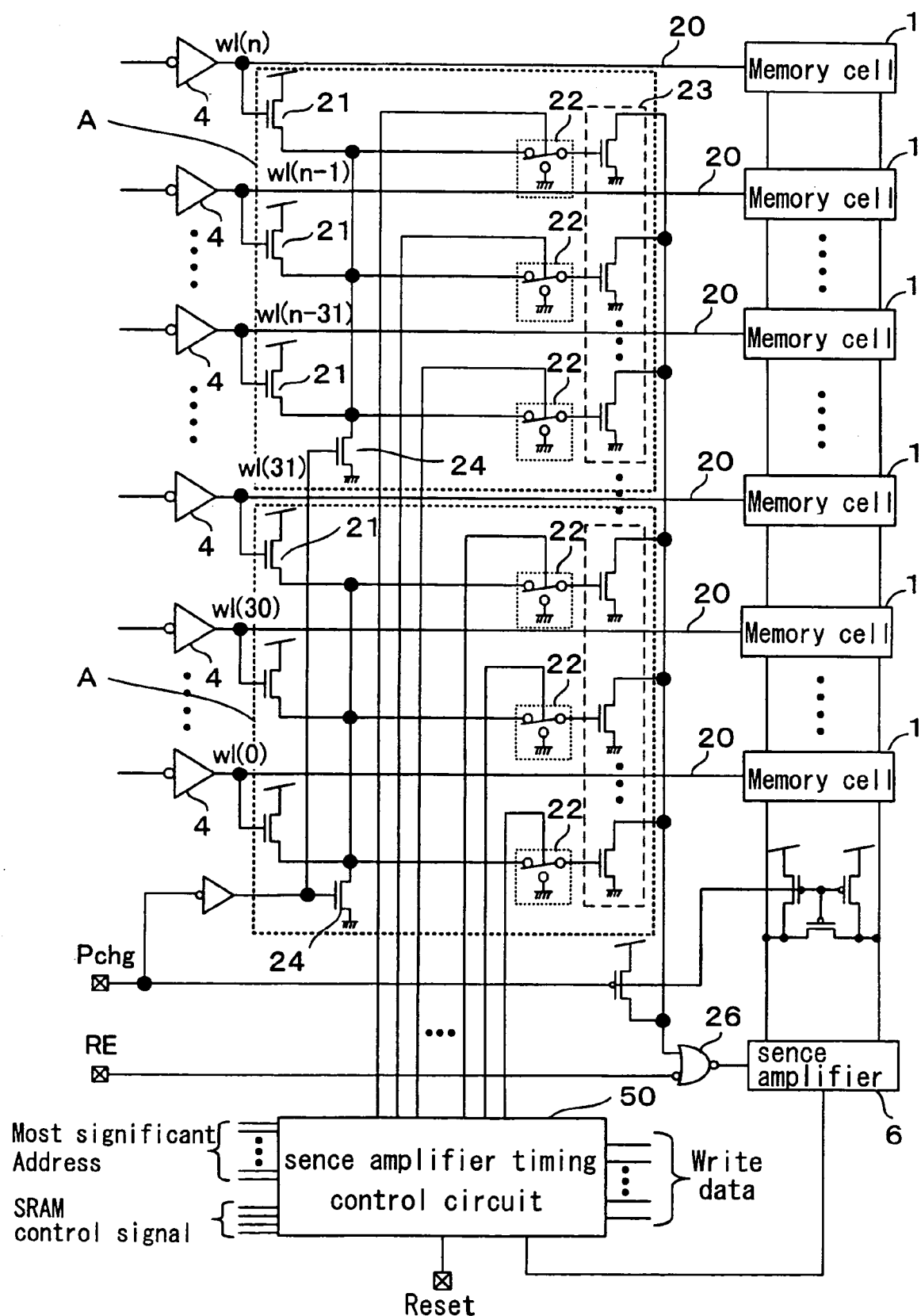
FIG. 4 is a schematic circuit diagram of a semiconductor memory storage according to a fourth embodiment of the invention.

FIG. 4 is a schematic circuit diagram of a SRAM as a semiconductor memory storage according to a fourth embodiment of the invention. In FIG. 4, the same component parts as the corresponding ones of the prior art shown in FIG. 5 and the embodiment shown in FIG. 1 are designated by the same reference numerals, respectively, and not described again. In FIG. 4, numeral 50 designates a timing control circuit for the sense amplifier. The sense amplifier timing control circuit 50, upon receipt of a reset signal, outputs the most significant address, a SRAM control signal and a preset specific write data. The most significant address is output to a row decoder (not shown), and the write data is output to a data input unit (not shown). Further, the timing control circuit 50 for the sense amplifier is connected to the output terminal of the sense amplifier 6 on the one hand and to the control terminal of each selective switching element 22 in the word line responsive sense amplifier control circuit A on the other hand. Specifically, the timing circuit 50 for the sense amplifier is supplied with the detection result of the sense amplifier 6 and compares it with the specific write data, and in the case where they coincide with each other or the write operation is successful, sequentially increases the number of times the selective switching element 22 is turned on. This write and read operation is repeated until the write operation ends in failure.

The operation of the semiconductor memory storage according to this embodiment having the above-mentioned configuration is explained below.

The basic operation is substantially the same as that of the first embodiment. The difference from the first embodiment lies in that the timing control circuit 50 for the sense amplifier, when supplied with a reset signal, turns on only one of the plurality of the selective switching elements 22 which corresponds to the most significant address, and outputting the most significant address and the specific write data, performs the write operation with a SRAM control signal. Next, in accordance with the SRAM control signal, the read operation is performed, and the output of the sense amplifier 6 is fetched into the sense amplifier timing control circuit 50 and compared with the specific write data. In the case where the two signals are coincident with each other, the selective switching element 22 corresponding to the next address is turned on, and thus increases the number of the replica transistors 23 in the on state. This write and read operation is repeated until the result of comparison fails to coincide.

As described above, according to this embodiment, in addition to the effect of the first embodiment, the sense amplifier timing control circuit 50 can automatically set the operation timing of the sense amplifier associated with the highest reading speed by repeatedly monitoring the read operation of the sense amplifier 6.

In addition to the applications of the SRAM explained above with reference to the first to fourth embodiments, a similar effect is obtained by application to a read-only memory or other memories.

It will thus be understood from the foregoing description that according to this invention, there is provided a semiconductor memory storage in which an enable signal for the sense amplifier can be generated from the word lines used for actual operation, and regardless of variations in production conditions, temperature or voltage conditions, the activation timing of the sense amplifier can be controlled at a high rate with high accuracy. At the same time, the number of the transistors (replica transistors) used for this purpose is reduced for a reduction in the area occupied by the circuits.

From the above description, it will be apparent that the present invention provides.

What is claimed is:

1. A semiconductor memory storage comprising:
    a memory cell array with a plurality of memory cells arranged in a matrix;
    a plurality of word line drivers connected through word lines to a plurality of the memory cells arranged in a row in said memory cell array for activating said word lines in accordance with the result of decoding an address signal;
    a sense amplifier for detecting the activated state of said memory cells; and
    a word line responsive sense amplifier control circuit connected to said word lines for activating said sense amplifier upon activation of said word lines,
    wherein said word line responsive sense amplifier control circuit includes:
    a discharge switching element inserted between a dummy bit line and the ground potential;
    a plurality of word line responsive switching elements connected to said word lines for transmitting the activation signal of said word lines to said discharge switching element; and
    a logic gate for outputting an enable signal to said sense amplifier in response to the discharge of said dummy bit line.

2. A semiconductor memory storage according to claim 1, wherein said word line responsive sense amplifier control circuit includes:
    a plurality of said discharge switching elements connected in parallel to said dummy bit line; and
    a plurality of word line responsive switching elements adapted to be closed by the activation signal of said word lines for activating the control signal, and supplying said activated control signal to the control terminals of said plurality of the discharge switching elements.

3. A semiconductor memory storage according to claim 2, further comprising a plurality of selective switching elements each inserted between said plurality of the word line responsive switching elements and each of said plurality of the discharge switching elements.

4. A semiconductor memory storage according to claim 3, further comprising a sense amplifier timing control circuit for repeating, until the write operation ends in a failure, the process of outputting a specific address and a predetermined write data, determining the result of the write operation in response to a detection output of said sense amplifier and in the case where said write operation is successful, sending out a control signal for sequentially increasing the number of times said plurality of the selective switching elements are turned on.

5. A semiconductor memory storage according to claim 1, wherein said discharge responsive switching elements are replica n-channel field-effect transistors for said memory cells.

6. A semiconductor memory storage according to claim 1, further comprising:
   a metal wire arranged adjacently in parallel to said dummy bit line and having an end thereof grounded; and
   a plurality of selective switching elements inserted at predetermined intervals on said metal wire.

7. A semiconductor memory storage according to claim 1, wherein said discharge switching elements are each configured of a transistor as a dummy cell for optical correction around each of said memory cells.

8. A semiconductor memory storage comprising:
   a memory cell array with a plurality of memory cells arranged in a matrix;
   a plurality of word line drivers each connected through a word line to a plurality of memory cells arranged in a row in said memory cell array for activating said word line in accordance with the result of decoding an address signal; and
   a sense amplifier connected to a pair of bit lines connected to a plurality of the memory cells in a column for detecting the potential difference generated between said bit lines by the operation of reading said memory cells;
   said semiconductor memory storage further comprising:
   a plurality of n-channel field-effect transistors each with the gate thereof connected to the corresponding one of said word lines and the drain thereof connected to the high potential side of a power supply;
   a plurality of replica n-channel field-effect transistors inserted in parallel between a dummy bit line and the grounding potential, the gate of each of said replica n-channel field-effect transistors being connected to the source of the corresponding one of said n-channel field-effect transistors; and
   a logic gate for outputting a read enable signal as an enable signal for said sense amplifier in response to the discharge of said dummy bit line in response to the turning on of said replica n-channel field-effect transistors.

9. A semiconductor memory storage according to claim 8, further comprising:
   a metal wire arranged adjacently in parallel to said dummy bit line and having an end thereof grounded; and
   a plurality of selective switching elements inserted at predetermined intervals on said metal wire.

10. A semiconductor memory storage according to claim 8, wherein said n-channel field-effect transistors are replaced with a plurality of inverters for logically inverting the output of said word line drivers, and a plurality of p-channel field-effect transistors each with the gate thereof connected to the corresponding one of said inverters and the source thereof connected to the high potential side of the power supply.

11. A semiconductor memory storage according to claim 8, wherein a selective switching element is interposed between each of said plurality of the n-channel field-effect transistors and the corresponding one of said plurality of the replica n-channel field-effect transistors.

12. A semiconductor memory storage according to claim 8, further comprising a row decoding circuit for selectively deactivating at least selected one of said word line drivers in response to an enable signal for said sense amplifier.

13. A semiconductor memory storage according to claim 11, further comprising a sense amplifier timing control circuit for repeating, until the write operation ends in a failure, the process of outputting a specific address and a predetermined write data, determining the result of the write operation in response to a detection output of said sense amplifier and in the case where the write operation is successful, sending out a control signal for sequentially increasing the number of times said plurality of the selective switching elements are turned on.

14. A semiconductor memory storage according to claim 8, wherein each of said replica n-channel field-effect transistors is configured of a transistor as a dummy cell for optical correction around each of said memory cells.

* * * * *